(12) United States Patent
Matsubara et al.

(10) Patent No.: US 9,570,637 B2
(45) Date of Patent: Feb. 14, 2017

(54) SOLAR CELL AND MANUFACTURING METHOD OF THE SAME

(71) Applicant: Panasonic Intellectual Property Management Co., Ltd., Osaka (JP)

(72) Inventors: Naoteru Matsubara, Osaka (JP); Taiki Hashiguchi, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/219,282

(22) Filed: Jul. 26, 2016

(65) Prior Publication Data

US 2016/0336463 A1    Nov. 17, 2016

Related U.S. Application Data

(63) Continuation of application No. PCT/JP2014/079475, filed on Nov. 6, 2014.

(30) Foreign Application Priority Data

Jan. 28, 2014   (JP) ................................. 2014-013350

(51) Int. Cl.
  *H01L 31/00* (2006.01)
  *H01L 31/0224* (2006.01)
  (Continued)

(52) U.S. Cl.
  CPC ... *H01L 31/022441* (2013.01); *H01L 31/0224* (2013.01); *H01L 31/022475* (2013.01);
  (Continued)

(58) Field of Classification Search
  CPC ............... H01L 31/022441; H01L 31/022466; H01L 31/022475; H01L 31/022483; H01L 31/0682; H01L 31/1804; Y02E 10/50
  (Continued)

(56) References Cited

U.S. PATENT DOCUMENTS

2008/0061293 A1* 3/2008 Ribeyron ........ H01L 31/022433
                                                         257/53
2013/0186456 A1* 7/2013 Ide .................. H01L 31/035281
                                                         136/255
2013/0247970 A1   9/2013 Morigami et al.

FOREIGN PATENT DOCUMENTS

WO    2011-105554 A1    9/2011

OTHER PUBLICATIONS

International Search Report (ISR) issued Feb. 3, 2015 on PCT Application No. PCT/JP2014/079475.

* cited by examiner

*Primary Examiner* — Lindsey Bernier
(74) *Attorney, Agent, or Firm* — MOTS Law, PLLC (57) ABSTRACT

A solar cell includes: a semiconductor substrate having a light receiving surface and a back surface; a first semiconductor layer of the first conductivity type on the back surface; a second semiconductor layer of the second conductivity type on the back surface; a first electrode electrically connected to the first semiconductor layer; and an insulating layer for electrically insulating the first semiconductor layer and the second semiconductor layer from each other in a region in which an edge of the first semiconductor layer and an edge of second semiconductor layer overlap. The first electrode includes a first transparent electrode layer and a first collection electrode layer on the first transparent electrode layer. The first transparent electrode layer is separated into a primary electrode layer that is on the first semiconductor layer and a separated electrode layer that is on the second semiconductor layer in the region.

3 Claims, 7 Drawing Sheets

(51) Int. Cl.
*H01L 31/0352* (2006.01)
*H01L 31/0747* (2012.01)
*H01L 31/18* (2006.01)

(52) U.S. Cl.
CPC ............ *H01L 31/022483* (2013.01); *H01L 31/03529* (2013.01); *H01L 31/0747* (2013.01); *H01L 31/1804* (2013.01); *Y02E 10/50* (2013.01)

(58) Field of Classification Search
USPC ....................................... 136/252, 255, 256
See application file for complete search history.

SOLAR CELL AND MANUFACTURING METHOD OF THE SAME

CROSS REFERENCE TO RELATED APPLICATIONS

This application is a U.S. continuation application of PCT International Patent Application Number PCT/JP2014/079475 filed on Nov. 6, 2014, claiming the benefit of priority of Japanese Patent Application Number 2014-013350 filed on Jan. 28, 2014, the entire contents of which are hereby incorporated by reference.

TECHNICAL FIELD

The present disclosure relates to a solar cell and a manufacturing method of a solar cell.

BACKGROUND ART

A back contact solar cell in which an n-type semiconductor layer and a p-type semiconductor layer are formed on the back surface of a semiconductor substrate is known (for example, see WO2011/105554).

SUMMARY

With a conventional back contact solar cell, in a manufacturing process of etching a transparent electrode, etching liquid may seep in through the interface between the transparent electrode and a semiconductor layer, and the transparent electrode may be etched and a void may be formed. Since liquid can seep in through this void, a conventional back contact solar cell is not resistant to moisture.

An object of the present disclosure is to provide a solar cell that is resistant to moisture and a manufacturing method of such a solar cell.

According to one aspect of the present disclosure, a solar cell includes: a semiconductor substrate of one of a first conductivity type and a second conductivity type having a light receiving surface and a back surface; a first semiconductor layer of the first conductivity type on the back surface; a second semiconductor layer of the second conductivity type on the back surface; a first electrode electrically connected to the first semiconductor layer; a second electrode electrically connected to the second semiconductor layer; and an insulating layer for electrically insulating the first semiconductor layer and the second semiconductor layer from each other in a region in which an edge of the first semiconductor layer and an edge of second semiconductor layer overlap. The first electrode includes a first transparent electrode layer and a first collection electrode layer on the first transparent electrode layer. The first transparent electrode layer is separated into a primary electrode layer that is on the first semiconductor layer and a separated electrode layer that is on the second semiconductor layer in the region. The first collection electrode layer is continuous across the primary electrode layer and the separated electrode layer.

According to one aspect of the present disclosure, a manufacturing method of a solar cell including: a semiconductor substrate of one of a first conductivity type and a second conductivity type having a light receiving surface and a back surface; a first semiconductor layer of the first conductivity type on the back surface; a second semiconductor layer of the second conductivity type on the back surface; a first electrode electrically connected to the first semiconductor layer; a second electrode electrically connected to the second semiconductor layer; and an insulating layer for electrically insulating the first semiconductor layer and the second semiconductor layer from each other in a region in which an edge of the first semiconductor layer and an edge of second semiconductor layer overlap, includes: forming the first semiconductor layer on the semiconductor substrate; forming the insulating layer on the edge of the first semiconductor layer; forming the second semiconductor layer on the semiconductor substrate such that the edge of the second semiconductor layer is disposed on the insulating layer and extends further over the first semiconductor layer than an edge of the insulating layer does; forming a first transparent electrode layer of the first electrode on the first semiconductor layer and on the second semiconductor layer in the region; forming a first collection electrode layer of the first electrode on the first transparent electrode layer; and forming the second electrode on the second semiconductor layer.

Accordingly, a solar cell that is resistant to moisture can be provided.

BRIEF DESCRIPTION OF THE DRAWINGS

The figures depict one or more implementations in accordance with the present teaching, by way of examples only, not by way of limitations. In the figures, like reference numerals refer to the same or similar elements.

DETAILED DESCRIPTION

The following describes an embodiment. The embodiment is purely illustrative, and is not intended to limit the scope of the present disclosure. In the drawings, elements having essentially the same function may share like reference numbers.

Solar Cell Embodiment

Figure 1:
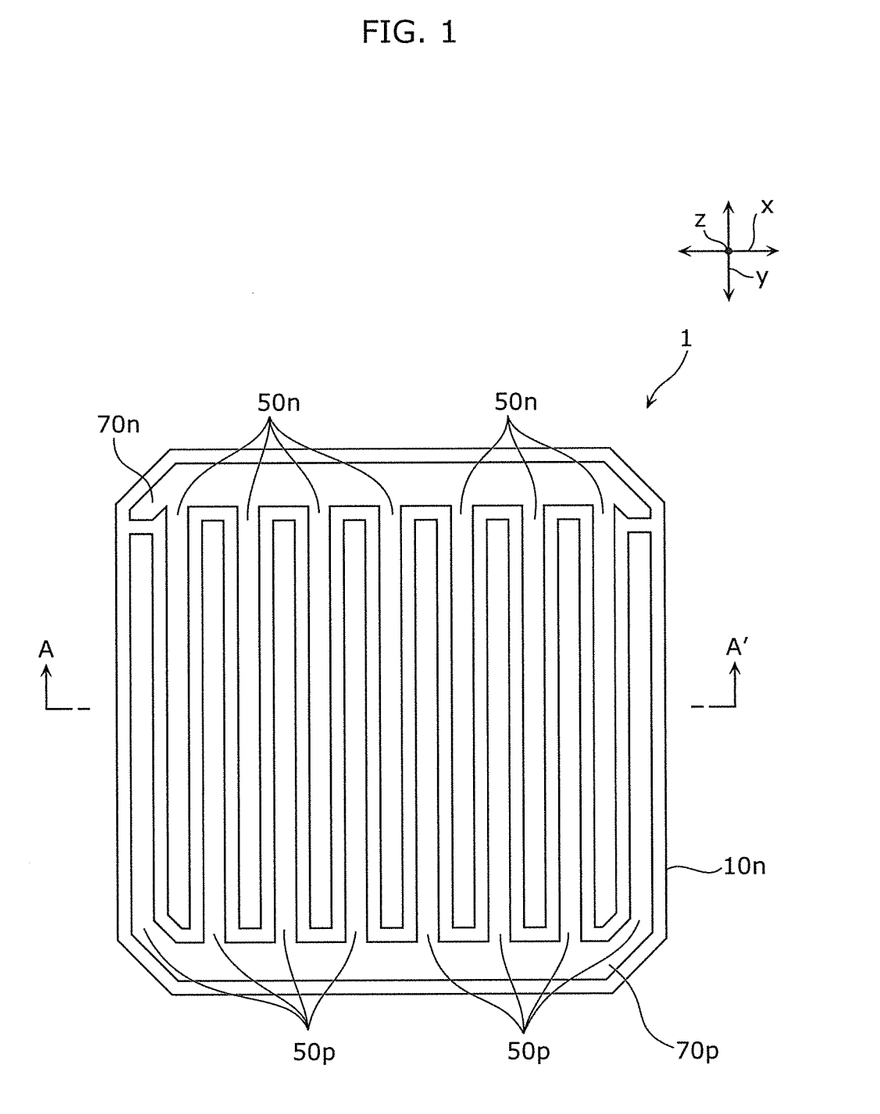
FIG. 1 is a plan view of the back of a solar cell according to an embodiment.
Figure 2:
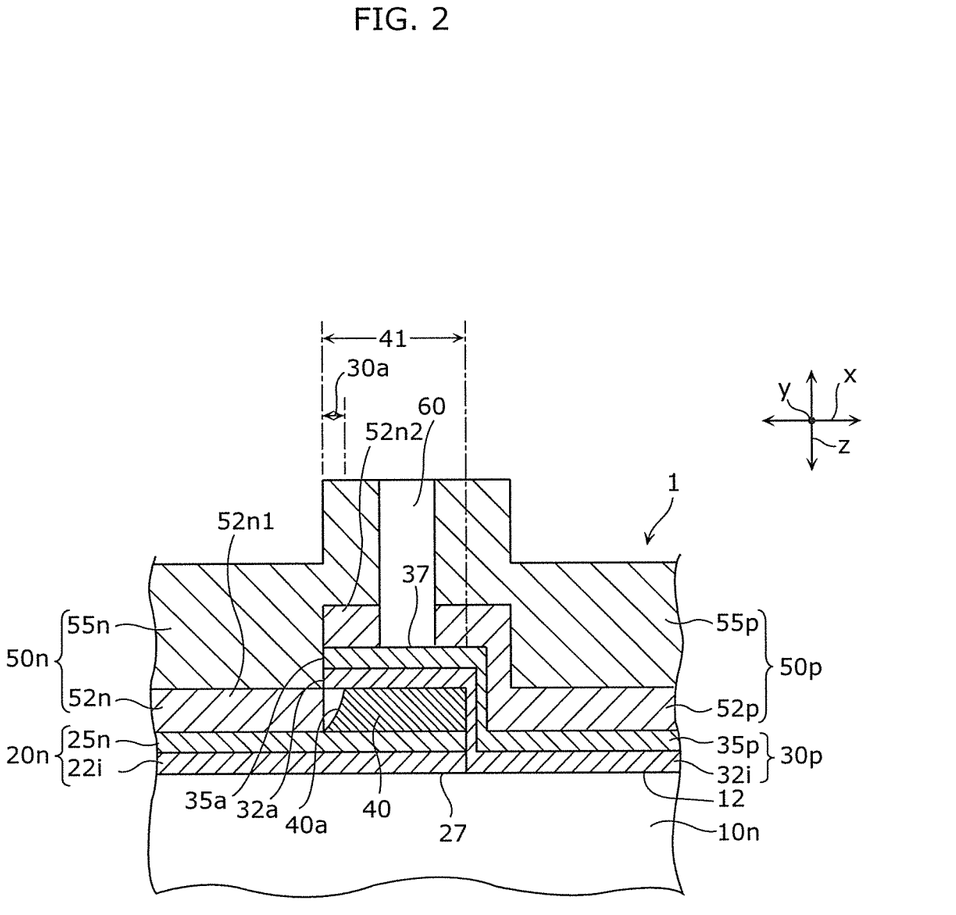
FIG. 2 is a cross sectional view of a solar cell according to an embodiment taken along line A-A' in FIG. 1.

As illustrated in FIG. 1 and FIG. 2, the solar cell 1 includes a semiconductor substrate 10n, a first semiconductor layer 20n, a second semiconductor layer 30p, an insulating layer 40, a first electrode 50n, a second electrode 50p, a connecting electrode 70n, and a connecting electrode 70p.

The semiconductor substrate 10n has a light receiving surface that receives light on one side, and a back surface 12 on the reverse side. The semiconductor substrate 10n generates carriers (electrons and electron holes) upon the light receiving surface receiving light.

The semiconductor substrate $10n$ has an n-type or p-type electrical conductivity, and may be made of a crystalline semiconductor such as a monocrystalline or polycrystalline silicon, or a common semiconductor including a compound semiconductor such as GaAs, InP, etc. The light receiving surface and the back surface 12 of semiconductor substrate $10n$ are finely textured. Although not illustrated in the drawings, no light-blocking structure (such as an electrode) is provided on the light receiving surface of the semiconductor substrate $10n$. As such, the semiconductor substrate $10n$ is capable of receiving light across the entire light receiving surface. The light receiving surface may be covered with a passivation layer. A passivation layer has passivating characteristics which reduce carrier recombination. A passivation layer may include a substantially intrinsic amorphous semiconductor layer formed without adding a dopant or by adding a small amount of a dopant.

The semiconductor substrate $10n$ is a first conductivity type or second conductivity type semiconductor substrate. In this embodiment, the semiconductor substrate $10n$ is exemplified as a first conductivity type semiconductor substrate. The semiconductor substrate $10n$ is also exemplified as an n-type monocrystalline silicon substrate. Therefore, in this embodiment, the first conductivity type is n-type.

The first semiconductor layer $20n$ is formed on the back surface 12 of the semiconductor substrate $10n$. The first semiconductor layer $20n$ is formed so as to have a lengthwise dimension (i.e., a long direction). The long direction corresponds with the y-direction. Like the semiconductor substrate $10n$, the first semiconductor layer $20n$ is also a first conductivity type semiconductor layer. The first semiconductor layer $20n$ is an n-type amorphous semiconductor layer. With this, carrier recombination at the interface between the back surface 12 of the semiconductor substrate $10n$ and the first semiconductor layer $20n$ can be reduced.

The second semiconductor layer $30p$ is formed on the back surface 12 of the semiconductor substrate $10n$. The second semiconductor layer $30p$ is formed so as to have a long direction y. Unlike the semiconductor substrate $10n$, the second semiconductor layer $30p$ is a second conductivity type semiconductor layer. The second semiconductor layer $30p$ is a p-type amorphous semiconductor layer. Thus, the junction between the semiconductor substrate $10n$ and the second semiconductor layer $30p$ is a p-n junction. The second semiconductor layer $30p$ is also formed on the insulating layer 40.

In this embodiment, as illustrated in FIG. 2, the first semiconductor layer $20n$ includes an i-type amorphous semiconductor layer $22i$ and an n-type amorphous semiconductor layer $25n$. The i-type amorphous semiconductor layer $22i$ is formed on the back surface 12 of the semiconductor substrate $10n$. The n-type amorphous semiconductor layer $25n$ is formed on the i-type amorphous semiconductor layer $22i$. With such a structure of the n-type semiconductor substrate $10n$, the i-type amorphous semiconductor layer $22i$, and the n-type amorphous semiconductor layer $25n$, it is possible to further reduce carrier recombination at the back surface of the semiconductor substrate $10n$.

In this embodiment, as illustrated in FIG. 2, the second semiconductor layer $30p$ includes an i-type amorphous semiconductor layer $32i$ and a p-type amorphous semiconductor layer $35p$. The i-type amorphous semiconductor layer $32i$ is formed on the back surface 12 of the semiconductor substrate $10n$. The p-type amorphous semiconductor layer $35p$ is formed on the i-type amorphous semiconductor layer $32i$. With such a structure of the n-type semiconductor substrate $10n$, the i-type amorphous semiconductor layer $32i$, and the p-type amorphous semiconductor layer $35p$, it is possible to improve p-n junction characteristics.

The i-type amorphous semiconductor layer $22i$, the i-type amorphous semiconductor layer $32i$, the n-type amorphous semiconductor layer $25n$, and the p-type amorphous semiconductor layer $35p$ may each be made of an amorphous semiconductor including hydrogen. Examples of such an amorphous semiconductor include amorphous silicon, amorphous silicon carbide, and amorphous silicon germanium. Note that the amorphous semiconductor layer is not limited to this example; other amorphous semiconductor layers may be used. The i-type amorphous semiconductor layer $22i$, the i-type amorphous semiconductor layer $32i$, the n-type amorphous semiconductor layer $25n$, and the p-type amorphous semiconductor layer $35p$ may each be made of only one type of amorphous semiconductor. The i-type amorphous semiconductor layer $22i$, the i-type amorphous semiconductor layer $32i$, the n-type amorphous semiconductor layer $25n$, and the p-type amorphous semiconductor layer $35p$ may each include a combination of two or more types of amorphous semiconductors.

As illustrated in FIG. 2, the first semiconductor layer $20n$ and the second semiconductor layer $30p$ are alternately arranged. The arrangement direction of the first semiconductor layer $20n$ and the second semiconductor layer $30p$ corresponds with the x-direction. In the solar cell 1, the arrangement direction x and the long direction y are orthogonal.

An edge 27 of the first semiconductor layer $20n$ in the arrangement direction x and an edge 37, in the arrangement direction x, of the second semiconductor layer $30p$ adjacent the first semiconductor layer $20n$ overlap in region 41. In the region 41, the insulating layer 40 is disposed between the edge 27 of the first semiconductor layer $20n$ and the edge 37 of the second semiconductor layer $30p$. The insulating layer 40 may be made of, for example, aluminum nitride, silicon nitride, or silicon oxide.

The first electrode $50n$ is electrically connected to the first semiconductor layer $20n$. As illustrated in FIG. 1, the first electrode $50n$ is formed along the long direction y. The first electrode $50n$ includes a first transparent electrode layer $52n$ and a first collection electrode $55n$. The first transparent electrode layer $52n$ is formed on the first semiconductor layer $20n$. The first transparent electrode layer $52n$ is also formed on the second semiconductor layer $30p$ formed on the insulating layer 40. The first transparent electrode layer $52n$ is made of an electrically conductive material having light transmitting characteristics. The first transparent electrode layer $52n$ may be made of, for example, indium tin oxide (ITO), stannous oxide, or zinc oxide. The first collection electrode $55n$ is formed on the first transparent electrode layer $52n$. The first collection electrode $55n$ may be formed with a plating method after a base metal has been formed on the first transparent electrode layer $52n$. Alternatively, the first collection electrode $55n$ may be formed with an electrically conductive resin paste using a resin material as the binder and electrically conductive particles, such as silver particles, as a filler, or with a sputtering method in which silver, for example, is used.

The second electrode $50p$ is electrically connected to the second semiconductor layer $30p$. As illustrated in FIG. 1, the second electrode $50p$ is formed along the long direction y. The second electrode $50p$ includes a second transparent electrode layer $52p$ and a second collection electrode $55p$. The second transparent electrode layer $52p$ is formed on the second semiconductor layer 30p. The second collection electrode 55p is formed on the second transparent electrode layer 52p. The second transparent electrode layer 52p and the second collection electrode 55p may be made of the same material as the first transparent electrode layer 52n and the first collection electrode 55n, respectively.

The first electrode 50n and the second electrode 50p collect carriers. The first electrode 50n and the second electrode 50p are isolated from each other by an isolation trench 60 for preventing short circuits. The isolation trench 60 is formed along the long direction y.

As illustrated in FIG. 1, the connecting electrode 70n is electrically connected to the ends of the plurality of first electrodes 50n. The connecting electrode 70p is electrically connected to the ends of the plurality of second electrodes 50p. The connecting electrode 70n and the connecting electrode 70p collect the carriers collected by the plurality of first electrodes 50n and the plurality of second electrodes 50p, respectively.

As illustrated in FIG. 2, in this embodiment, the first transparent electrode layer 52n is separated into a primary electrode layer 52n1 formed on the first semiconductor layer 20n and a separated electrode layer 52n2 formed on the second semiconductor layer 30p in the region 41. As such, in the manufacturing method of the solar cell according to this embodiment, upon patterning a transparent electrode layer with and etching liquid and forming the isolation trench 60, the etching liquid can be prevented from seeping in through the interface between the first transparent electrode layer 52n in the vicinity of the isolation trench 60 and the first semiconductor layer 20n. In other words, when the first transparent electrode layer 52n is not separated but rather continuous, etching liquid that has seeped in reaches the interface between the first transparent electrode layer 52n and the first semiconductor layer 20n whereby a void is formed between the first transparent electrode layer 52n and the first semiconductor layer 20n. When such a void is formed, moisture can seep in through the void, which reduces the resistance to moisture of the solar cell.

In this embodiment, since the first transparent electrode layer 52n is separated into a primary electrode layer 52n1 and a separated electrode layer 52n2, etching liquid that seeps in through the interface between the separated electrode layer 52n2 and the first semiconductor layer 20n pools in the region 41 and does not seep further in. Thus, the etching liquid can be prevented from reaching the interface between the first transparent electrode layer 52n, which has the important function of collecting charge, and the first semiconductor layer 20n. As a result, the moisture resistance of the solar cell can be improved. Note that etching liquid entering the region 41 is not problematic since the region 41 is not important for charge collection. Note that "separated" here does not necessarily mean completely separated, and includes separation to a degree that prevents etching liquid from seeping in. As such, the primary electrode layer 52n1 and the separated electrode layer 52n2 may be connected in part so long as they are separated to a degree that prevents etching liquid from seeping in.

In this embodiment, an overhang 30a is formed as a result of the edge 37 of the second semiconductor layer 30p (i.e., the distal end 32a of the i-type amorphous semiconductor layer 32i and the distal end 35a of the p-type amorphous semiconductor layer 35p) extending in a direction toward the first semiconductor layer 20n, beyond the edge 40a of the insulating layer 40. In this embodiment, due to the formation of the overhang 30a, the first transparent electrode layer 52n is separated into the primary electrode layer 52n1 and the separated electrode layer 52n2. However, the present disclosure is not limited to this example; the first transparent electrode layer 52n may be separated into the primary electrode layer 52n1 and the separated electrode layer 52n2 via a different method.

Solar Cell Manufacturing Method Embodiment

Figure 3:
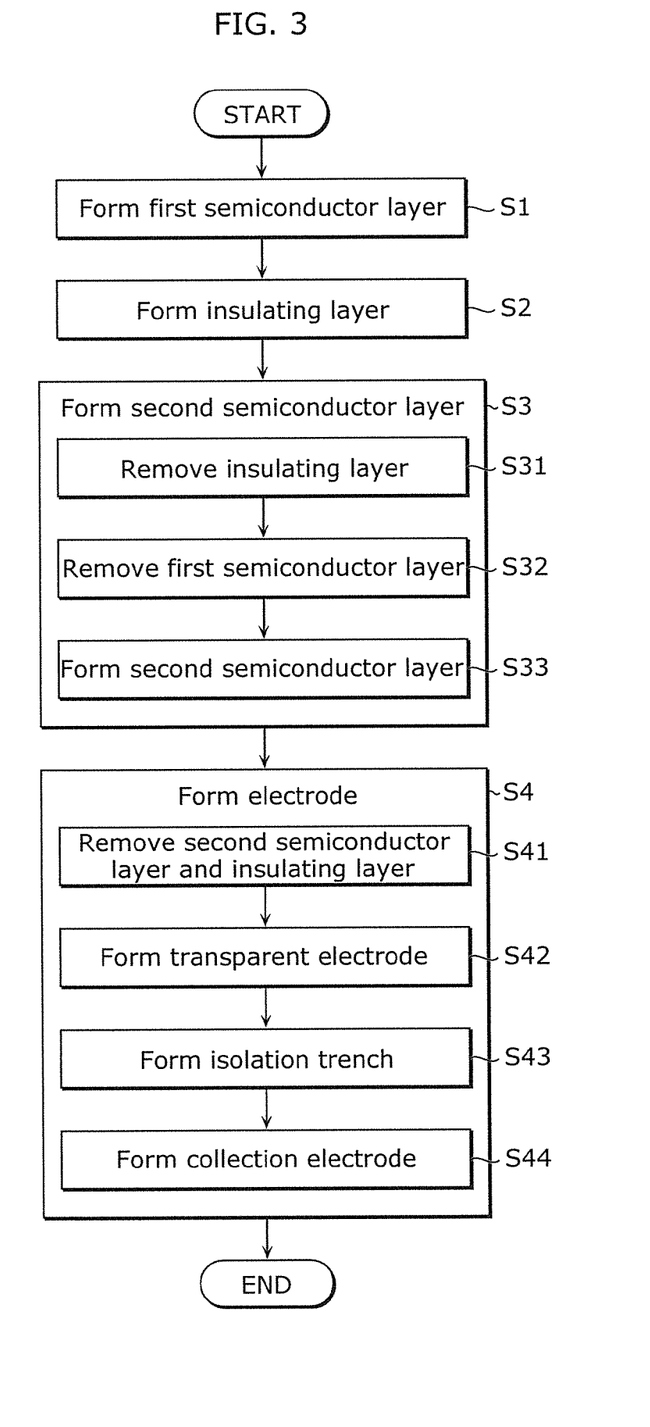
FIG. 3 is a flow chart illustrating solar cell manufacturing processes according to an embodiment.

The manufacturing method of the solar cell 1 according to this embodiment will be described with reference to FIG. 3 through FIG. 10. FIG. 3 is a flow chart for a manufacturing method of the solar cell 1 according to this embodiment. FIG. 4 through FIG. 10 are cross sectional views for illustrating a manufacturing method of the solar cell 1 according to this embodiment.

As illustrated in FIG. 3, the manufacturing method of the solar cell 1 includes Steps S1 through S4.

Step S1 is forming the first semiconductor layer 20n of the first conductivity type on the back surface 12 of the semiconductor substrate 10n of the first conductivity type. First, the semiconductor substrate 10n is prepared. In order to clean the surface of the semiconductor substrate 10n, the semiconductor substrate 10n is etched with an acid or alkali solution. The light receiving surface of the semiconductor substrate 10n is treated so as to have a texture for reducing light reflection. The back surface 12 of the semiconductor substrate 10n is more planar than the light receiving surface. The i-type amorphous semiconductor layer 22i is formed on the back surface 12 of the prepared semiconductor substrate 10n. The n-type amorphous semiconductor layer 25n is formed on the i-type amorphous semiconductor layer 22i. The i-type amorphous semiconductor layer 22i and the n-type amorphous semiconductor layer 25n are formed by, for example, chemical vapor deposition (CVD). In Step S1, the first semiconductor layer 20n is formed on the back surface 12.

Figure 4:
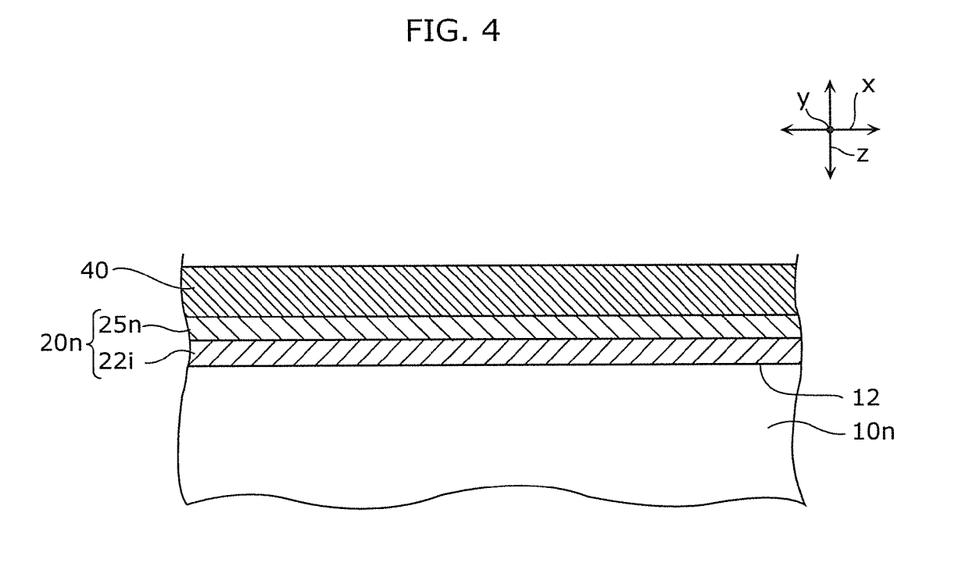
FIG. 4 is a cross sectional view for illustrating a solar cell manufacturing method according to an embodiment.

Step S2 is forming the insulating layer 40 having electrical insulating properties. The insulating layer 40 is formed on the first semiconductor layer 20n formed in Step S1. More specifically, as illustrated in FIG. 4, the insulating layer 40 is formed on the n-type amorphous semiconductor layer 25n. The insulating layer 40 is formed by, for example, CVD.

Step S3 is forming the second semiconductor layer 30p of the second conductivity type on the back surface 12 of the semiconductor substrate 10n of the first conductivity type. Step S3 includes Steps S31 through S33.

Figure 5:
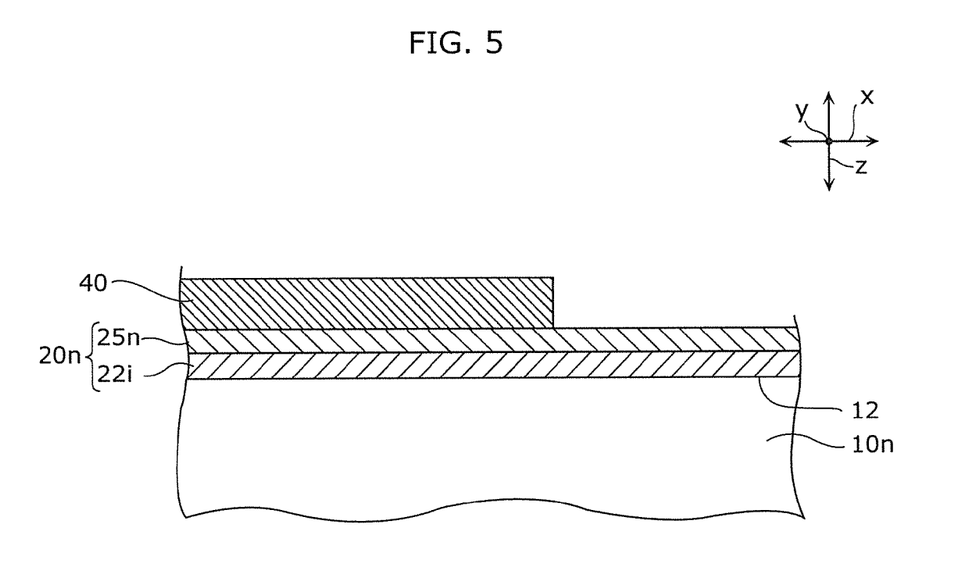
FIG. 5 is a cross sectional view for illustrating a solar cell manufacturing method according to an embodiment.

Step S31 is removing the insulating layer 40 formed on the first semiconductor layer 20n. Resist is applied to the insulating layer 40 using a photolithography or screen printing method. Looking at the back surface 12 from the vertical direction z, the resist is applied to the insulating layer 40 in portions corresponding to where the second semiconductor layer 30p is to be formed. Then, portions of the insulating layer 40 not covered by resist are melted and removed by etching liquid. As a result, the first semiconductor layer 20n is exposed, as illustrated in FIG. 5.

Methods other than patterning using a resist include partially removing the insulating layer 40 using an etching paste. The method of partially removing the insulating layer 40 is not limited to these examples; other methods may be used.

Figure 6:
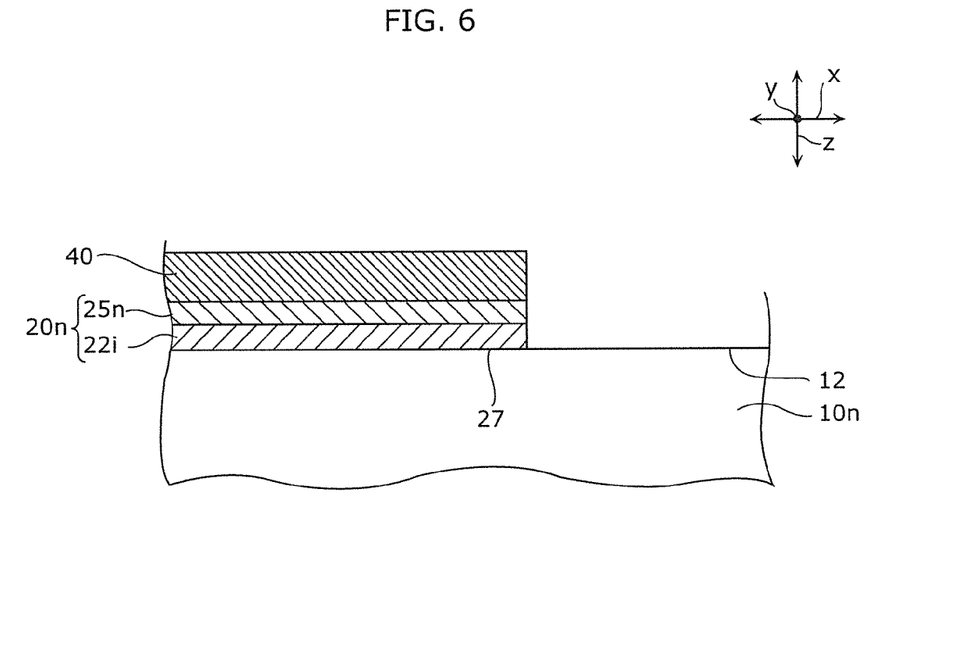
FIG. 6 is a cross sectional view for illustrating a solar cell manufacturing method according to an embodiment.

Step S32 is removing the portions of the first semiconductor layer 20n exposed after the removal of the insulating layer 40. The exposed first semiconductor layer 20n is alkali washed. As a result, the semiconductor substrate 10n is exposed, as illustrated in FIG. 6.

In Step S32, the remaining portions of the insulating layer 40 that have not been removed function as a protective layer that protects the first semiconductor layer 20n.

Figure 7:
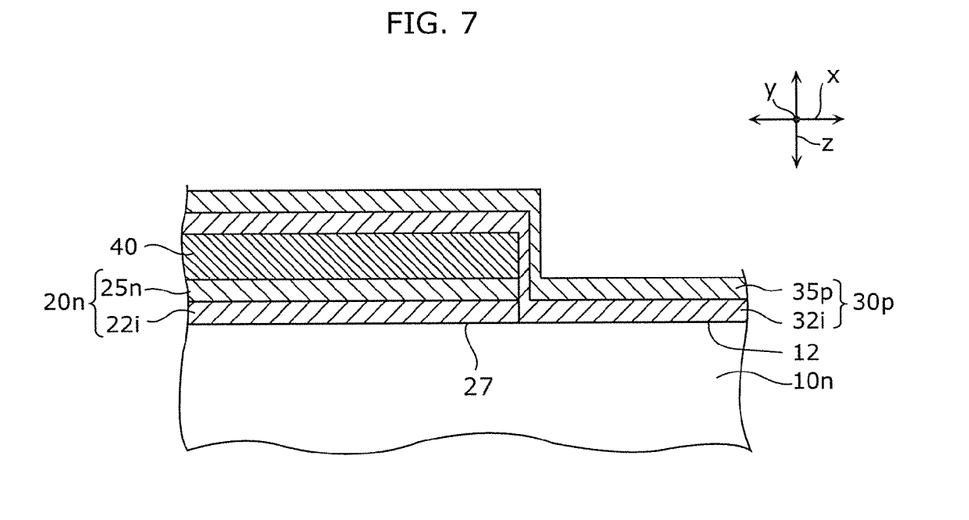
FIG. 7 is a cross sectional view for illustrating a solar cell manufacturing method according to an embodiment.

Step S33 is forming the second semiconductor layer 30p on the semiconductor substrate 10n exposed as a result of removing the first semiconductor layer 20n. The i-type amorphous semiconductor layer 32i is formed on the back surface 12 of the semiconductor substrate 10n. The p-type amorphous semiconductor layer 35p is formed on the i-type amorphous semiconductor layer 32i. The i-type amorphous semiconductor layer 32i and the p-type amorphous semiconductor layer 35p are formed by, for example, CVD. As a result of Step S22, the second semiconductor layer 30p is formed n the back surface 12. As illustrated in FIG. 7, in the solar cell 1, the second semiconductor layer 30p is formed across the entire surface. Thus, the second semiconductor layer 30p is formed on the insulating layer 40 in addition to on the back surface 12.

Step S4 is forming the first electrode 50n and the second electrode 50p. Step S4 includes Steps S41 through S44.

Figure 8:
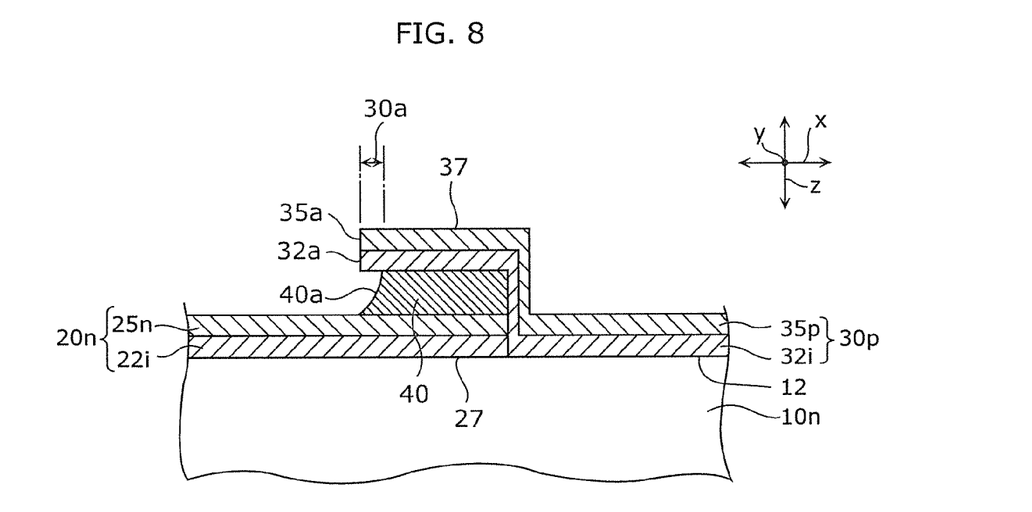
FIG. 8 is a cross sectional view for illustrating a solar cell manufacturing method according to an embodiment.

Step S41 is removing the second semiconductor layer 30p and the insulating layer 40. Resist is applied using a photolithography or screen printing process on the second semiconductor layer 30p formed on the insulating layer 40, on portions of the second semiconductor layer 30p that are to remain. Then, after using an etching liquid, portions of the second semiconductor layer 30p and the insulating layer 40 on which resist was applied remain, as illustrated in FIG. 8. Portions of the second semiconductor layer 30p and the insulating layer 40 on which resist was not applied are removed.

In this embodiment, the second semiconductor layer 30p and the insulating layer 40 are etched with mutually different etching liquids. The second semiconductor layer 30p is etched with, for example, hydrofluoric acid. The insulating layer 40 is etched with, for example, hydrogen fluoride (HF). In this embodiment, when etching the second semiconductor layer 30p, by implementing a weak etching condition, the edge 37 of the second semiconductor layer 30p extends further over the first semiconductor layer 20n than the edge 40a of the insulating layer 40 so as to have an overhang 30a. The weak etching condition can be achieved by, for example, reducing the etching time or using a weak etching liquid. However, the present disclosure is not limited to this example; the overhang 30a may be formed by other methods.

Figure 9:
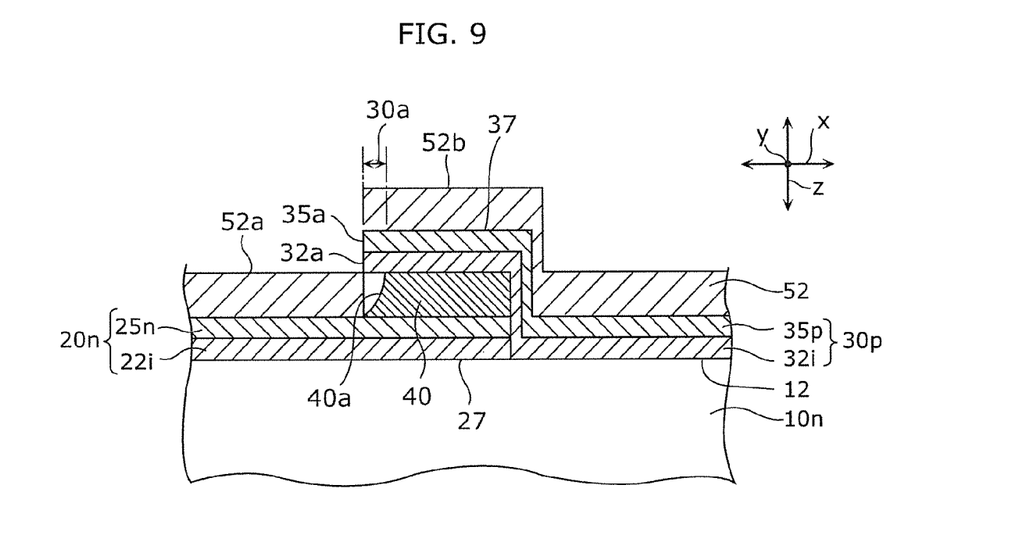
FIG. 9 is a cross sectional view for illustrating a solar cell manufacturing method according to an embodiment.

Step S42 is forming a transparent electrode layer 52. As illustrated in FIG. 9, the transparent electrode layer 52 is formed on the first semiconductor layer 20n and the second semiconductor layer 30p using a physical vapor deposition (PVD) method. In this embodiment, since the overhang 30a is formed, the transparent electrode layer 52 is separated into a transparent electrode layer 52a and a transparent electrode layer 52b at the overhang 30a.

Afterward, in the present embodiment, a base metal layer to function as the base for the first collection electrode 55n and the second collection electrode 55p is formed using a PVD method. Examples of the base metal include Ti and Cu.

Figure 10:
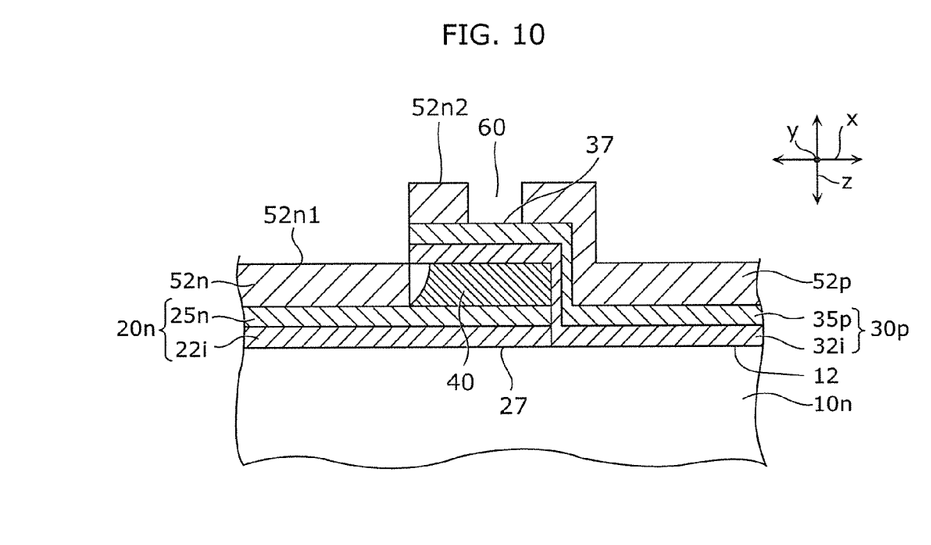
FIG. 10 is a cross sectional view for illustrating a solar cell manufacturing method according to an embodiment.

Step S43 is forming the isolation trench 60 for preventing short circuits. The isolation trench 60 is formed using a laser. Forming the isolation trench 60 divides the transparent electrode layer 52b into the separated electrode layer 52n2 and a second transparent electrode layer 52p. The transparent electrode layer 52a becomes the primary electrode layer 52n1. In this embodiment, the isolation trench 60 is formed using a laser, but the isolation trench 60 may be formed using, for example, a resist and an etching liquid.

Step S44 is forming the first collection electrode 55n and the second collection electrode 55p. The first collection electrode 55n and the second collection electrode 55p are formed on the first transparent electrode layer 52n and the second transparent electrode layer 52p, respectively, using a plating method. Here, there first collection electrode 55n is continuous across the primary electrode layer 52n1 and the separated electrode layer 52n2. Note that the first collection electrode 55n and the second collection electrode 55p may be formed using a screen printing method in which an electrically conductive paste is applied to the transparent electrode 52 and then sintered.

The solar cell 1 illustrated in FIG. 2 can thus be manufactured as described above.

In the above embodiment, the semiconductor substrate 10n is exemplified as being of a first conductivity type—that is to say, is exemplified as an n-type semiconductor substrate, but the semiconductor substrate 10n may be of a second conductivity type—that is to say, may be a p-type semiconductor substrate.

In the above embodiment, the first semiconductor layer 20n includes the i-type amorphous semiconductor layer 22i and the n-type amorphous semiconductor layer 25n, but the first semiconductor layer 20n may be composed of the n-type amorphous semiconductor layer 25n only. Similarly, the second semiconductor layer 30p may be composed of the p-type amorphous semiconductor layer 35p only.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

The invention claimed is:

1. A solar cell, comprising:
   a semiconductor substrate of one of a first conductivity type and a second conductivity type having a light receiving surface and a back surface;
   a first semiconductor layer of the first conductivity type on the back surface;
   a second semiconductor layer of the second conductivity type on the back surface;
   a first electrode electrically connected to the first semiconductor layer;
   a second electrode electrically connected to the second semiconductor layer; and
   an insulating layer for electrically insulating the first semiconductor layer and the second semiconductor layer from each other in a region in which an edge of the first semiconductor layer and an edge of second semiconductor layer overlap,
   wherein the first electrode includes a first transparent electrode layer and a first collection electrode layer on the first transparent electrode layer,
   the first transparent electrode layer is separated into a primary electrode layer that is on the first semiconductor layer and a separated electrode layer that is on the second semiconductor layer in the region, and
   the first collection electrode layer is continuous across the primary electrode layer and the separated electrode layer.

2. The solar cell according to claim 1, wherein the second electrode includes a second transparent electrode layer and a second collection electrode layer on the second transparent electrode layer.

3. The solar cell according to claim 1, wherein the edge of the second semiconductor layer in the region extends further over the first semiconductor layer than an edge of the insulating layer does.

* * * * *